US006837627B2

(12) United States Patent
Nakanishi et al.

(10) Patent No.: US 6,837,627 B2
(45) Date of Patent: Jan. 4, 2005

(54) OPTICAL COMMUNICATION MODULE

(75) Inventors: Hiromi Nakanishi, Osaka (JP); Yoshiki Kuhara, Osaka (JP); Takeshi Okada, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 23 days.

(21) Appl. No.: 10/296,377

(22) PCT Filed: Apr. 11, 2002

(86) PCT No.: PCT/JP02/03642

§ 371 (c)(1),
(2), (4) Date: Nov. 25, 2002

(87) PCT Pub. No.: WO02/089274

PCT Pub. Date: Nov. 7, 2002

(65) Prior Publication Data

US 2003/0169981 A1 Sep. 11, 2003

(30) Foreign Application Priority Data

Apr. 25, 2001 (JP) ...................... 2001-127564

(51) Int. Cl.$^7$ ................................ G02B 6/36
(52) U.S. Cl. .......................... 385/92; 385/94
(58) Field of Search ............................ 385/47, 48, 49, 385/88–94, 137

(56) References Cited

U.S. PATENT DOCUMENTS 5,113,404 A   5/1992   Gaebe et al. ............. 372/36
6,485,197 B1 * 11/2002   Kato ...................... 385/92

FOREIGN PATENT DOCUMENTS

| EP | 0 465 230 | 8/1992 |
| JP | 61-158970 | 10/1986 |
| JP | 3-62583 | 3/1991 |
| JP | 3-105985 | 5/1991 |
| JP | 9-311232 | 12/1997 |
| JP | 10-22576 | 1/1998 |
| JP | 2002-200937 | 7/2000 |
| JP | 2000-228555 | 8/2000 |
| JP | 2001-108872 | 4/2001 |
| WO | WO 01/23932 | 5/2001 |

OTHER PUBLICATIONS

K. Yoshida, et al., "Optical coupling properties of LD module using resin moulding", The Institute of Electronics, Information and Communication Engineers, General Convention, C–3–68, p. 253 (1997) and English translation thereof.

* cited by examiner

Primary Examiner—Chau N. Nguyen
(74) Attorney, Agent, or Firm—Smith, Gambrell & Russell, LLP

(57) ABSTRACT

An optical communication module, such as an optical transmitter used for optical communication incorporating a semiconductor laser (LD) and a monitoring photodiode (MPD), and an optical transceiver including a photodiode (PD), is efficiently and inexpensively provided. As means therefor, two substrates are used, that is, an expensive and high-accuracy first substrate is accommodated in an recess provided in a second substrate that is inexpensive and that needs less accuracy. An optical transmission system is mounted on the first substrate, and the MPD is mounted on the second substrate having an inclined surface provided on an opposite side of the recess in terms of the optical transmission direction. This eases production work and simultaneously allows the decreaseed use of expensive substrates.

16 Claims, 11 Drawing Sheets

FIRST EMBODIMENT

FIRST EMBODIMENT

SECOND EMBODIMENT

SECOND EMBODIMENT

FIG. 6  THIRD EMBODIMENT

THIRD EMBODIMENT

FIG. 8 FOURTH EMBODIMENT

FIFTH EMBODIMENT

SIXTH EMBODIMENT

SEVENTH EMBODIMENT

EIGHTH EMBODIMENT

OPTICAL COMMUNICATION MODULE

TECHNICAL FIELD

The present invention relates to an optical communication module incorporating a semiconductor laser diode and a monitoring photodiode used for optical communication. More particularly, the present invention relates to an optical transmitter that has been reduced in size and cost by simply arranging the monitoring photodiode, or relates to an optical communication module including the same. The optical transmitter refers to a module combining a semiconductor laser (Laser Diode; LD) generating transmitting signals and a monitoring photodiode (Monitoring Photodiode; MPD) monitoring the output thereof. Since the semiconductor laser varies in the current and optical output characteristic due to secular changes thereof, it is necessary to monitor the intensity of light and to maintain the optical output power constant. For this purpose, a module using an LD is frequently equipped with an MPD.

The optical transceiver (LP/PD Module) refers to one combining such an optical transmitter (LD Module), and an optical receiver (PD module) comprising a photodiode (PD) for receiving signals from an opposite side. That is, the optical transceiver comprises an LD, an MPD, and a PD, and in some cases, further comprises an amplifier for amplifying the signals, and a driving IC. Here, as a comprehensive concept including an optical transmitter and an optical transceiver, a term "optical communication module" is used.

BACKGROUND ART

FIG. 1 shows an example of an optical transmission module comprising (LD+MPD) that is in actual use at present. This is an LD module of a cylindrical metal package type that incorporates a lens 12, a lens holder 13, an LD 4, an MPD 5 and the like within a cylindrical metal case (not shown). The semiconductor laser (LD) 4 is affixed at an intermediate part of a pole 2 mounted on a disk-like metallic stem 1 that projects lead-pins 7, 8, and 9 downwardly from the bottom thereof, and that has the pole 2 vertically formed on the surface thereof. The monitoring photodiode (MPD) 5 is affixed, directly below the LD 4, to the stem surface via a sub-mount 6. The sub-mounts 3 and 6 of the LD 4 and the MPD 5 are connected to the lead-pins 8 and 9 by bonding-wires 10 and 11, respectively. A lens 12 is disposed directly above the LD 4.

The lens 12 is attached to a cylindrical lens holder 13. After the lens 12 and the LD 4 having been aligned with each other, the lens holder 13 is soldered to the stem 1. The front end 14 of an optical fiber is held by a cylindrical ferrule (not shown), and is inserted into a ferrule holder with a tapered cylinder shape. After being aligned, the ferrule holder is soldered onto the lens holder 13. Furthermore, a bend-limiter (not shown) is inserted into the lens holder 13 in order to inhibit excessive bending of the optical fiber.

The optical transmitter accommodated in such a metal package has various advantages. Since the optical transmitter is sealed by metal and is filled with an inert gas, it is protected from moisture and oxygen, thereby allowing the LD and the MPD not to degradate easily. Also, since the optical transmitter is sealed by a metallic case, the entry and occurrence of noises is prevented. Signal light 15 once travels out in the space, but since it is condensed by the lens, it is efficiently made incident on the optical fiber. It is therefore possible for the optical transmitter to cover signals up to a high frequency region. With these superior properties, the metal package type optical transmission module (LD+MPD) has assumed a dominant position in transmission modules in optical communication.

The optical transmission module of a metal package type shown in FIG. 1 has already established a track record, and is well-known. However, in this optical transmission module, costs for components such as the package and the lens are high, and assembly cost is also high, since time and effort are consumed on the alignment of the center. In addition to the above-described drawback of being high-cost, the optical transmission module also has a large volume, thereby requiring a wide space when mounted on a printed circuit board.

For such a reason, surface-mountable LD modules have been proposed in order to reduce cost. Among various types proposed, for example, as a prior art, "Optical Coupling Characteristics of Resin Mold Type LD Module" by Koji Yoshida, Takeshi Kato, Toshinori Hirata, Fumio Yuki, Kimio Tateno, and Toshio Miura, 1997, The Institute of Electronics, Information and Communication Engineers, General Convention, C-3-68, p. 253, proposes a surface-mountable LD module in which an optical fiber, an LD, and an MPD are arranged in one plane on an Si-substrate. FIG. 2 shows the configuration in outline of this prior art. This module is under development, and not yet in actual use. A V-groove 18 is formed along a central axis line up to a midway of a planar Si-substrate 17. A single mode optical fiber 19 is halfway embedded in the V-groove 18. At positions on an extension line of axis of the optical fiber 19, an LD 20 and an edge illuminated MPD 21 are mounted on the Si-substrate 17.

The edge illuminated MPD 21 is also referred to as a "waveguide type PD", since the light receiving part 24 thereof is provided along a waveguide. While the MPD 21 is a particular MPD, it has a structure allowing horizontal incidence, so that a core 22 of the optical fiber, a light emitting part 23 of the LD, and a light receiving part 24 of the MPD 21 are arranged in a straight line. The electrode of each of the LD 20 and the MPD 21, and the metallized part on the Si-substrate are interconnected by wire bonding.

The end of the optical fiber 19, the LD 20, and the MPD 21 are covered with a transparent resin 25. The front light of the LD enters the optical fiber 19 and propagates therethrough. The rear light of the LD travels horizontally and directly enters the MPD 21, by which the rear light is detected. In this module, by mounting both the semiconductor laser and monitoring photodiode on the same Si-substrate, it is possible to reduce the assembling process, and simultaneously to reduce its size.

With regard to the function of this edge illuminated MPD, the rear light of the LD is received by the monitoring photodiode, and a semiconductor laser driving circuit, (which is included in another module), is controlled so that the optical output power W becomes constant, and the average value <W> of the transmitting light (front light) of the semiconductor laser is maintained constant. While having a very simplified structure, the edge illuminated MPD is a particular element and is lacking in universality. In addition, the edge illuminated MPD suffers from a drawback of a low incidence efficiency of the LD rear light.

Conventional optical transmitters (LD+MPD) have further problems. An example of a conventional surface-mountable module FIG. 2) has a simple configuration in which an optical fiber, an LD, and an MPD are arranged in a straight line. Since the LD and the MPD are mounted on the same Si-substrate, it appears possible to enable a simplified mounting process. However, the light receiving part (MPD) is of a waveguide type, and the area of the part on which light can be made incident is small. This causes a low coupling efficiency of monitoring light. Also, the alignment requires strict accuracy to the same extent as the case of mounting the semiconductor laser. When light is made incident on the edge face, the light beams would fail to enter the MPD if light beams are vertically deviated at a minimum, because the waveguide has a small thickness. That is, most of the rear light would not enter the MPD. Since the monitoring light is weak, the reliability of the feedback control of the LD is low.

Therefore, in order to further draw on the features of the surface mounting technique, a simpler layout of the monitoring photodiode is desirable. A structure that allows the light amount entering the MPD to increase by simplifying the relationship between the LD and the MPD and thereby facilitating the mounting, is earnestly required. It is a first object of the present invention to propose an optical communication module equipped with an LD module that allows more LD rear light to be sensed and that enables a higher accuracy of LD current control. Moreover, it is a second object to propose an optical communication module equipped with a compact and low-cost LD module.

DISCLOSURE OF INVENTION

The present invention uses not one substrate but two substrates. The important point in the present invention is that a first substrate is used in the part requiring high accuracy, and a second substrate is used in the part requiring moderate accuracy.

The part requiring high accuracy refers to a part including the coupling between the optical transmitting medium and the LD. Since the light emitted from the LD is small in diameter and large in spread angle, it is difficult to make the light from the LD incident on the optical transmitting medium. Such a part is disposed on the first substrate requiring high accuracy. The optical axis of the LD and that of the optical transmitting medium correspond accurately to each other. The part requiring moderate accuracy refers to the coupling part between the MPD and the LD, the coupling part between the LD and the driving IC, patterned electrode part, or the like. These parts are disposed on the second substrate. Of course, the first substrate is fixed on a part of the second substrate.

Specifically, the optical communication module of the present invention comprises a first substrate and a second substrate, the second substrate has a recess for accommodating the first substrate, and a wall surface of the recess continuous thereto is an inclined surface. In this optical communication module, a semiconductor laser (LD) for generating front light and rear light and a transmitting medium for transmitting the front light to the outside are disposed on the first substrate. Also, a monitoring photodiode (MPD) fixed on the inclined surface for receiving the rear light of the semiconductor laser is disposed on the second substrate. Furthermore, in this optical communication module, an electrical connection means for connecting an electrode of the semiconductor laser (LD) and an electrode of the monitoring photodiode (MPD) to a respective exterior circuit is provided on the first and second substrates, respectively.

The two substrates have required characteristics different from each other. This is advantageous in the workability even if the material for the two substrates is the same. Specifically, the mounting can be achieved such that the LD that requires high mounting accuracy is mounted on the first substrate, and the surface incident type MPD that requires moderate accuracy is obliquely mounted on the second substrate. The workability is improved by performing these jobs separately, and thereafter coalescing the two substrates.

For the first substrate requiring a high mounting accuracy, an Si single crystal substrate, a GaAs single crystal substrate, a Ge single crystal substrate, or the like can be used. While being expensive, these substrates allow high-accuracy processing. Alternatively, a metal with an insulating layer thereover may be used. Preferably, the above-described single crystal substrate is employed. In this case, it is possible to form an accurate V-groove by, for example, anisotropic etching or the like. Also, because there may be a case where an optical waveguide is formed on the surface of the substrate, an Si single crystal substrate is more preferable. Although the Si single crystal substrate is costly, it is an optimum substrate for the part requiring high mounting accuracy. In the present invention, because the first substrate is small in size, the costliness of the first substrate presents no problem.

For the second substrate requiring moderate mounting accuracy, of course, the same material as the first substrate can be used. In this case, the two substrates can be processed at separate places In particular, since the part on which the MPD is mounted must be connected to the inclined surface, performing work separately from the first substrate facilitates workability. However, since the second substrate does not require high accuracy, it is unnecessary to use an expensive substrate.

For the second substrate, a ceramic substrate is preferably used. For a ceramic substrate, use of aluminum oxide, aluminum nitride, beryllium oxide, boron nitride, or the like is advantageous in that the heat occurring when the LD is driven by a large current becomes prone to flow to the outside through the first substrate and then through the second substrate It is also effective that the second substrate is a polymer substrate. The polymer substrate is characterized in that a substrate can be produced easily and inexpensively using a mold or the like. The epoxy resin is a resin that is frequently used for sealing or packaging a semiconductor element and that can be easily treated. The epoxy resin also can be molded. Alternatively, a liquid crystal polymer can also be useful. The liquid crystal polymer can be mass-produced by a mold, and it allows the surface to be metallized. Also, the liquid crystal polymer is low cost in the material thereof, and has superior workability and sufficient accuracy. In particular, the advantage of its moldability makes it possible to mold the recess on which the first substrate is to be mounted, the inclined surface on which the MPD is to be mounted, and a large V-groove on which the ferrule is to be mounted.

As a combination of substrates, it is particularly preferable that the first substrate be an Si single crystal substrate and that the second substrate be a liquid crystal polymer substrate. Although an Si single crystal substrate is costly, it is possible to reduce the cost thereof by using it only for the parts which require high accuracy out of the entire substrate. The liquid crystal polymer substrate is not only inexpensive as compared with an Si single crystal substrate, but also allows uneven portions including the inclined structure part to be molded, that is, the liquid crystal polymer substrate is superior in workability, and the dimensional accuracy thereof can be improved up to a usable range.

In the mounting part of the optical communication module where the above-described two substrate are combined, an optical fiber can also be employed as an optical transmitting medium, as shown in FIG. 3, which transmits the light emitted from the LD to the outside. The alignment of the optical fiber with the LD can be accurately and easily performed with the V-groove formed in the first substrate. As the optical fiber, either a quartz-based or organic polymer-based optical fiber may be used.

Instead of directly using an optical fiber as the optical transmitting medium, the optical fiber can be used through the intermediary of an optical waveguide, (see FIGS. 9, 13 and others). The optical waveguide comprises a film of core and a cladding, and is formed on the first substrate. When the first substrate does not extend to an end of the second substrate (FIG. 9), the core position of the waveguide and that of the optical fiber disposed on the second substrate are aligned with each other. When the first substrate extend to an end of the second substrate (FIG. 13), the optical fiber is adhered to the end face of the waveguide from the outside of the module.

The above-described waveguide comprises a core and cladding, and as the material thereof, $SiO_2$-based waveguide or an organic polymer-base waveguide is used. The $SiO_2$-based waveguide is a well-known art, and can be produced by the flame deposition or sputtering methods. When Si is used for the first substrate, a stable low-loss waveguide can be formed. As for the organic polymer-based waveguide, polyimide resin or fluorinated polyimide resin, or the like is used, and it can be produced easily by spin coating or the like. The organic polymer-based substrate is low cost as compared with the above-described $SiO_2$-based waveguide.

The MPD mounted on the second substrate makes use of the inclined surface. The inclined surface is formed on the second substrate. As compared with a single substrate, the second substrate has an advantage of being able to freely form the inclined surface, so that a fixing groove wider than the surface of MPD can be formed for positioning the MPD. This fixing groove allows a high degree of flexibility in positioning to be achieved, and the fixing groove can accommodate solder or the like used when the MPD is soldered, thereby preventing the solder or the like from adversely affecting the part where the first substrate is mounted.

If a polymer substrate is selected as the second substrate, lead frames can be insert-formed when the substrate is produced. Examples in this case are illustrated in FIGS. 6 to 9. Herein, since the external electrodes are integrally formed, the production process is shortened, thereby reducing the cost.

In particular, as shown in the examples in FIGS. 6 to 9, when lead frames are previously insert-formed into the part on which the MPD is mounted, the erectrode of the MPD is easily taken out, thereby advantageously simplifying the production process.

While the inclined part provided in the second substrate is used for mounting the MPD, the MPD is disposed such that the center of the light detecting surface thereof is substantially located on an extension line of the optical axis of the LD. The inclination angle of the light detecting surface with respect to the optical axis is formed so as to be in a range of 30 to 60 degrees. Mounting work is difficult at the inclination angle over 60 degrees, and it is difficult to receive the monitoring light at the inclination angle under 30 degrees.

There is a space between the optical transmitting medium, which constitutes a light passage as an optical transmitting module, and each of the LD and the MPD. This part should not be subjected to any external influence, and is preferably covered with a transparent resin. The space left as it is causes problems due to the entry of dirt particles, environmental problems such as dew formation, characteristic degradation due to reflection between the edge faces of components, surface protection, and the like. Silicone resin or the like is suited for the material for the transparent resin.

Furthermore, when an anti-reflection coating is formed on the light detecting surface of the MPD, the intensity of light that is made incident on the MPD increases, and larger monitoring current can advantageously be obtained. For an anti-reflection coating, SiON, $TiO_2$, $Ta_2O_5$, and $Zr_2O_3$, or the like is used.

The LD and MPD used for the present module is desirable, particularly for use in long wavelength optical communication. It is preferable to use InGaAsP-based crystal for the LD, and InGaAs-based or InGaAsP-based crystal for the MPD.

It is possible to mount an LD driving element on the second substrate. This is because the MPD is mounted on the inclined surface, and consequently the distance from the LD to the rear part of the MPD is shortened, thereby allowing the LD driving element to be mounted dose to the LD. Mounting of the LD driving element close to the LD produces a short interconnection, thereby reducing signal distortion. Stray capacitance and parasitic inductance are also significantly reduced. This is advantageous to high-speed communication or high-frequency communication as well. Also, this offers the advantage of not incurring high cost even if such mounting part is large, because the second substrate is used for the part on which the LD driving element is mounted.

BEST MODE FOR CARRYING OUT THE INVENTION

Figure 3:
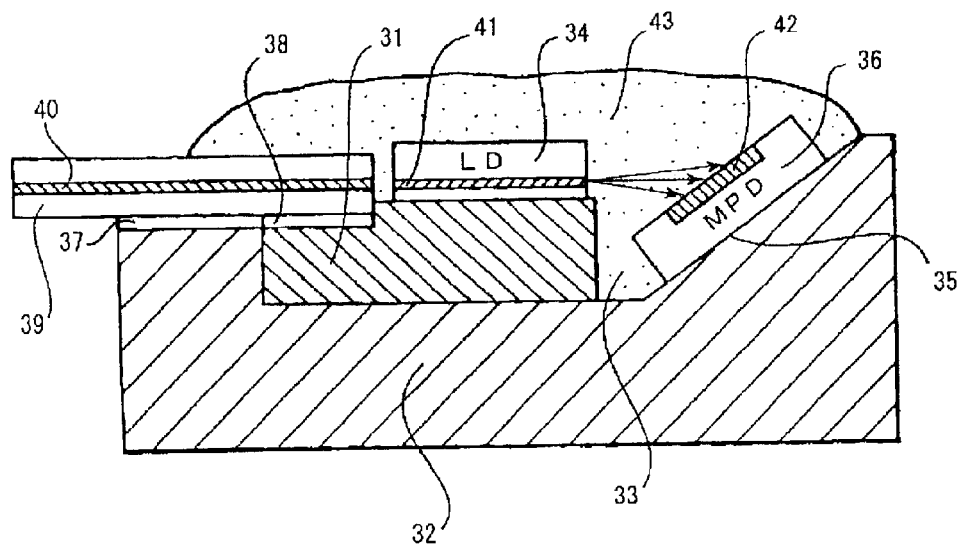
FIG. 3 is an axial cross-section view showing an optical communication module according to a first embodiment of the present invention in which an optical fiber is used as an optical transmitting medium.

[First Embodiment (Basic Form: Optical Fiber: FIG. 3)]

A first embodiment of the present invention will be described with reference to FIG. 3. A first substrate 31 is a substantially rectangular plate (sub-mount). An Si single crystal substrate was selected from among an Si single crystal substrate, a GaAs single crystal substrate, and a Ge single crystal substrate. A second substrate 32 is arranged to have a recess 33 in the central part on the top surface thereof, and to hold the first substrate 31 on the recess 33. A semiconductor laser chip (LD) 34 is fixed with an epitaxial face downward, to the rear half part of the top surface of the first substrate 31. An inclined surface 35 is provided behind the recess 33 of the second substrate 32, and a surface-incident type MPD 36 is fixed face up.

A second V-groove 37 is provided in the forward part of the second substrate 32. A first V-groove 38 is also provided in the forward part of the first substrate 31. The first V-groove 38 and the second V-groove 37 are continuous with each other, and the depths thereof are substantially equal. An optical fiber 39 is inserted into and fixed to the first and second V-grooves 38 and 37. While the depths of the first and second V-groove are equal, the tolerances thereof are different from each other. The second V-groove 37 of the second substrate 32 has a large tolerance, while the first V-groove 38 of the first substrate 31 has a small tolerance. Since the first substrate is an Si single crystal substrate, the V-groove can be formed accurately therein, thereby allowing the optical fiber 39 to be correctly positioned. This enables the coupling efficiency between the LD 34 and the optical fiber 39 to be increased. For this reason, a single crystal substrate such as an Si single crystal substrate is used for this part alone.

The core 40 of the optical fiber 39 and the light emitting part 41 of the LD 34 are arranged in a straight line. There exists on an extension line of the light emitting part 41 the intermediate part of the light receiving part 42 of a surface incident type MPD 36. Furthermore, a transparent resin 43 surrounds the LD 34, the MPD 36, and the optical fiber 39. These spaces allow the light of the LD to pass. If the space is constituted of air, the difference in the refractive index between air and the optical fiber 39 is too large, causing a large amount of back-reflection light. Therefore, these spaces are covered with a transparent resin such as silicone resin with a refractive index close to that of the optical fiber.

The front light emitted from the LD 34 enters the core 40 of the optical fiber 39, and is transmitted as signal light. The rear light emitted from the LD 34 passes through the transparent resin 43, and enters the light receiving part 42 of the monitoring photodiode (MPD) 36.

The producing method for the first embodiment will be described. The first substrate 31 is an Si single crystal substrate (sub-mount) of (100) plane with dimensions: 1.5 mm (width)×4 mm (length)×2 mm (thickness). At the stage of a single crystal Si wafer, the first V-groove 38 for fixing the optical fiber, and an Au metallized pattern for fixing the semiconductor laser are formed for every chip by photolithography and etching techniques. Since a plurality of chips is produced instantaneously by a wafer process, the cost thereof can be reduced. Also, since a V-groove is formed with the single crystal by anisotropic etching, accuracy can be secured. A semiconductor laser diode (LD) 34 light emitting layer: InGaAsP; light emission wavelength: 1.3 μm; dimensions: 300 μm (width)×300 μm (length)×120 μm (thickness)) is fixed to the sub-mount (first substrate 31) by soldering with Au—Sn.

On the other hand, the second substrate 32 (4 mm (width)×8 mm (length)×3 mm (the maximum thickness)) comprising a recess 33 for embedding the sub-mount 31, the inclined surface 35, and the V-groove 37 is produced using a liquid crystal polymer as a material, and employing a mold. The second substrate 32 has unevenness such as the recess and the grooves, therefore polymer, ceramic or the like that can mold fluidized materials is suitable. Since the liquid crystal polymer is resistant to heat at 300° C., the second substrate does not degrade during heating treatment after device mounting. A metallized pattern is formed on the top surface of the second substrate by printing, vapor deposition or the like. These patterns provide electrodes and wiring for applying a current and a voltage to the MPD and the LD.

Next, the MPD 36 (diameter of light receiving part: 200 μm; 400 μm (chip width)×400 μm (length)×200 μm (thickness)) using InGaAs for the light receiving layer is fixed on the inclined surface 35 of the second substrate 32 by soldering MPD 36 onto the Au metallize layer or by adhering it to the Au metallized layer with a resin.

At this time, arranging the center of the light receiving part 42 of the MPD 36 to be located on an extension line of the central axis (optical axis) of rear light of the semiconductor laser (LD) 34, enables the most efficient light reception.

Of course, forming an anti-reflection layer of dielectric film, such as SiON (or $TiO_2$, $Ta_2O_5$, and $Zr_2O_3$) on the light detecting surface of the MPD 36 further enhances the efficiency.

As the inclination angle of the inclined surface approaches a right angle, the light receiving efficiency increases. However, if the inclination angle is too near a right angle, it becomes difficult to mount the monitoring photodiode. Conversely, if the inclination is too close to a level, an effective light reception area for the monitoring light is reduced, so the monitoring current is reduced, thereby causing Auto Power Control (APC) to be unstable.

Figure 14:
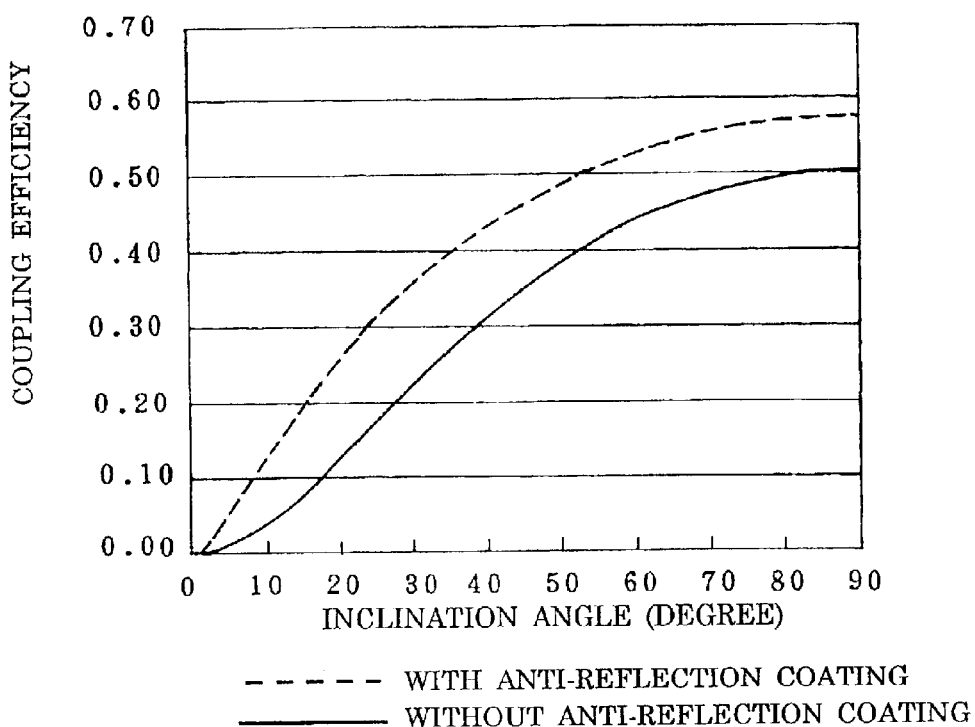
FIG. 14 is a diagram showing the calculated results of the coupling efficiency between the MPD and the LD which generate horizontal polarized light (S-wave), for the case without an anti-reflection coating and the case with an anti-reflection coating, with an inclined angle α set to 0 to 90 degrees, under the conditions: the wavelength of the LD is 1.3 μm; the light receiving diameter of the MPD is 200 μm; the distance between the rear end of the LD and the central point of the PD surface is 400 μm; the refractive index of the MPD is 3.5; the refractive index of the transparent resin is 1.46; and the refractive index of the anti-reflection coating is 1.8.

As a range meeting both the conditions, it is desirable to set the inclined angle of the light detecting surface from 30 to 60 degrees. The Table and FIG. 14 show the calculated results of the coupling efficiency between the MPD and the LD which generate horizontal polarized light (S-wave), for the case with reflection and the case with an anti-reflection coating, with an inclined angle α set to 0 to 90 degrees. The wavelength of the LD is 1.3 μm, the light receiving diameter of the MPD is 200 μm, and the distance between the rear end of the LD and the central point of the MPD surface is 400 μm. The refractive index of the MPD is 3.5, the refractive index of the transparent resin is 1.46, and the refractive index of the anti-reflection coating is 1.8. The Table shows inclined angles α and the corresponding coupling coefficients for the cases with and without an anti-reflection coating. The Table additionally shows the thicknesses of the used anti-reflection coatings. FIG. 14 is a diagram corresponding to the Table.

From these calculated results, it is seen that the coupling efficiencies not less than 20% are advantageous for APC, and that, in the case without anti-reflection coating, the inclined angle not less than 30 degrees is desirable. Performing anti-reflection coating processing at this angle produce a coupling efficiency over ⅓, thereby providing a desirable coupling efficiency region. The upper limit of the inclined angle is determined by the workability. If the inclined angle is too large when the MPD is mounted on the second substrate, the MPD mounting work becomes difficult. Preferably, the inclined angle is not more than 60 degrees.

TABLE

| INCLINED ANGLE α (DEGREES) | COUPLING EFFICIENCY | | ANTI-REFLECTION COATING THICKNESS (μm) |
|---|---|---|---|
| | WITHOUT ANTI-REFLECTION COATING | WITH ANTI-REFLECTION COATING | |
| 0 | 0.000 | 0.000 | 0.311 |
| 5 | 0.011 | 0.055 | 0.309 |
| 10 | 0.039 | 0.134 | 0.302 |
| 15 | 0.079 | 0.202 | 0.293 |
| 20 | 0.126 | 0.260 | 0.281 |
| 25 | 0.175 | 0.311 | 0.268 |
| 30 | 0.224 | 0.355 | 0.256 |
| 35 | 0.270 | 0.394 | 0.243 |
| 40 | 0.313 | 0.429 | 0.232 |
| 45 | 0.351 | 0.460 | 0.222 |
| 50 | 0.385 | 0.486 | 0.213 |
| 55 | 0.414 | 0.509 | 0.206 |
| 60 | 0.439 | 0.528 | 0.199 |
| 65 | 0.459 | 0.544 | 0.194 |
| 70 | 0.476 | 0.557 | 0.189 |
| 75 | 0.489 | 0.567 | 0.186 |
| 80 | 0.498 | 0.574 | 0.184 |
| 85 | 0.503 | 0.578 | 0.182 |
| 90 | 0.505 | 0.580 | 0.182 |

After the above-described first substrate 31 was fixed on the second substrate 32 made of a liquid crystal polymer (all aromatic type polyester resin), the optical fiber 39 was fixed in the V-grooves 37 and 38 with epoxy resin. At this time, the alignment between the optical fiber 39 and the LD 34 is accurately performed by the already formed V-groove 38 of Si-bench. It is preferable that the optical fiber fixing V-groove 37 of the second substrate be a slightly wider groove.

Thereafter, the LD 34 and the MPD 36 and surrounding electrodes (not shown) are interconnected by Au lines. Finally, light passages among the optical fiber, the semiconductor laser, the monitoring photodiode are covered with the transparent resin 43 such as a silicone-based resin, thereby performing potting. This stabilizes the optical characteristics.

Figure 4:
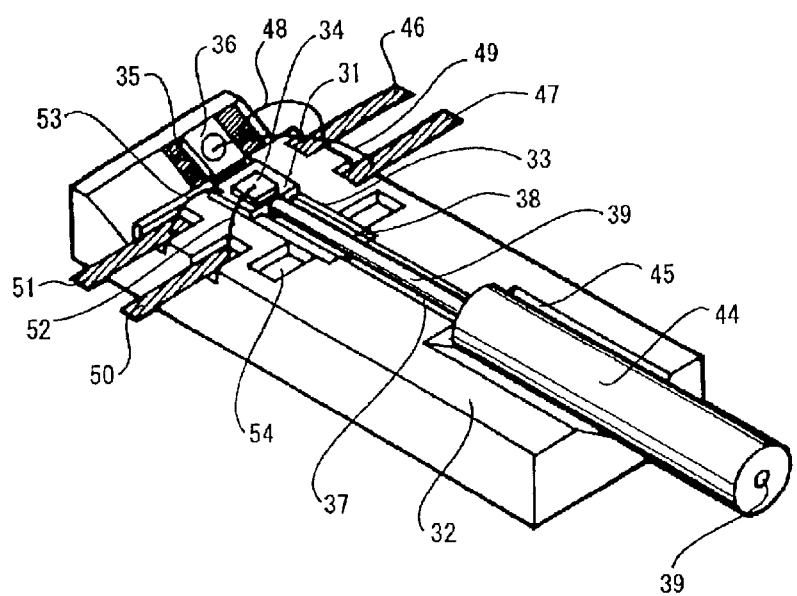
FIG. 4 is a perspective view showing an optical communication module according to a second embodiment of the present invention where an optical fiber is used as an optical transmitting medium and the optical fiber thereof is equipped with ferrule.
Figure 5:
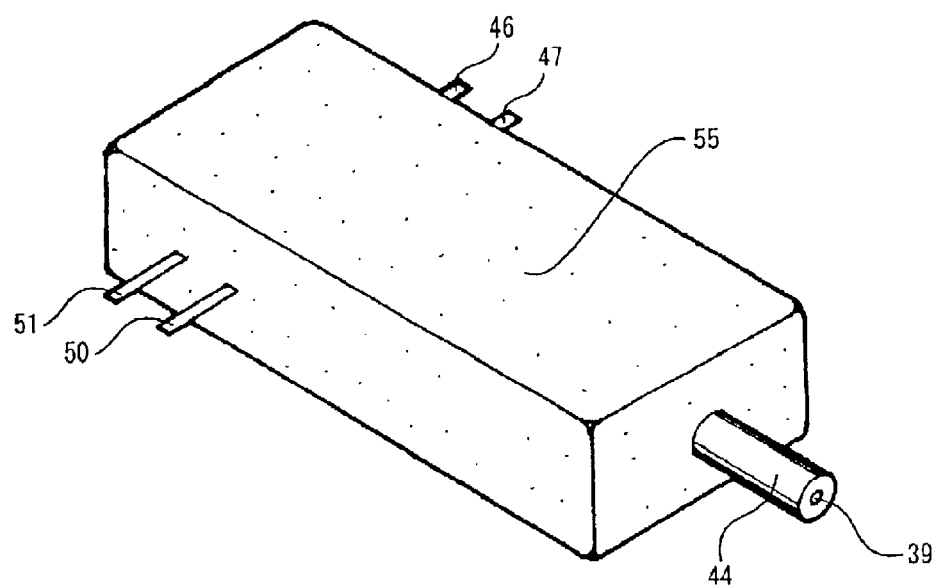
FIG. 5 is a perspective view showing a plastic-molded optical communication module according to the second embodiment of the present invention.

[Second Embodiment (Optical Fiber with Ferrule: FIGS. 4 and 5)]

FIG. 4 is a perspective view showing a device according to a second embodiment of the present invention. In the first embodiment, the optical fiber was affixed to the second and first substrates as it is. The second embodiment is such that a ferrule is affixed to the optical fiber for the ease of handling. The addition of the ferrule slightly changes the shape of the second substrate 32. The structure of the first substrate 31 for coupling the optical fiber 39 and the LD 34 together is the same as that of the above-described embodiment. A lead for the LD and leads for the MPD are also illustrated.

The first substrate 31 is an Si single crystal substrate, and the LD 34 is fixed on the metallized pattern at the rearward part of the first substrate 31. A V-groove 38 for the optical fiber is provided in the forward part of the first substrate 31. This first substrate 31 is inserted into and fixed to the recess 33 of the second substrate. A cylindrical ferrule 44 is fixed to the front end of the optical fiber 39. At the surface of the second substrate 32, there are provided a V-groove 37 for fixing the optical fiber 39, and a larger V-groove 45 for fixing the ferrule 44, besides the above-described recess 33. Since the second substrate 32 uses a liquid crystal polymer (all-aromatic type polyester resin), the second substrate can be produced by a mold, thereby allowing such unevenness to form easily.

A metallized pattern is formed on the second substrate 32, and leads are brazed to a part of the metallized pattern. Leads 46 and 47 seen on the rear side are brazed to the metallized pattern on the stepped-down part of the second substrate 32. The leads 46 and 47 are connected to a top electrode (p-electrode) and a bottom electrode (n-electrode) of the MPD 36 by wires 48 and 49, respectively. Leads 50 and 51 seen on the front side (in FIGS. 4 and 5) are connected to a bottom electrode (which faces upward since the epitaxial face is upside-down) of the LD and a stripe electrode (which is adhered to the metallized part of an Si-substrate since an epitaxial face is upside-down) by wires 52 and 53, respectively. A recess 54 is formed on the second substrate 32 in order to facilitate inserting the first substrate 31 in the recess 33.

FIG. 4 illustrates a state in which the electrodes of the LD and PD are connected to the leads, respectively. Subsequently after the illustrated state, the LD, PD, and a part of the optical fiber are covered with a transparent resin, as in the case of FIG. 3.

Moreover, by accommodating all of these into a metallic package or a ceramic package, a device can be produced. For a more inexpensive packaging, an outside shape may be formed by covering all of the substrates and the transparent resin with an epoxy-based resin. Whatever package structure is assumed, the front end of the ferrule 44 and the front end of each of the four leads 46, 47, 50, and 51 constitute interfaces with the outside. FIG. 5 is a perspective view showing an inexpensive package structure formed of molded plastic 55.

Figure 1:
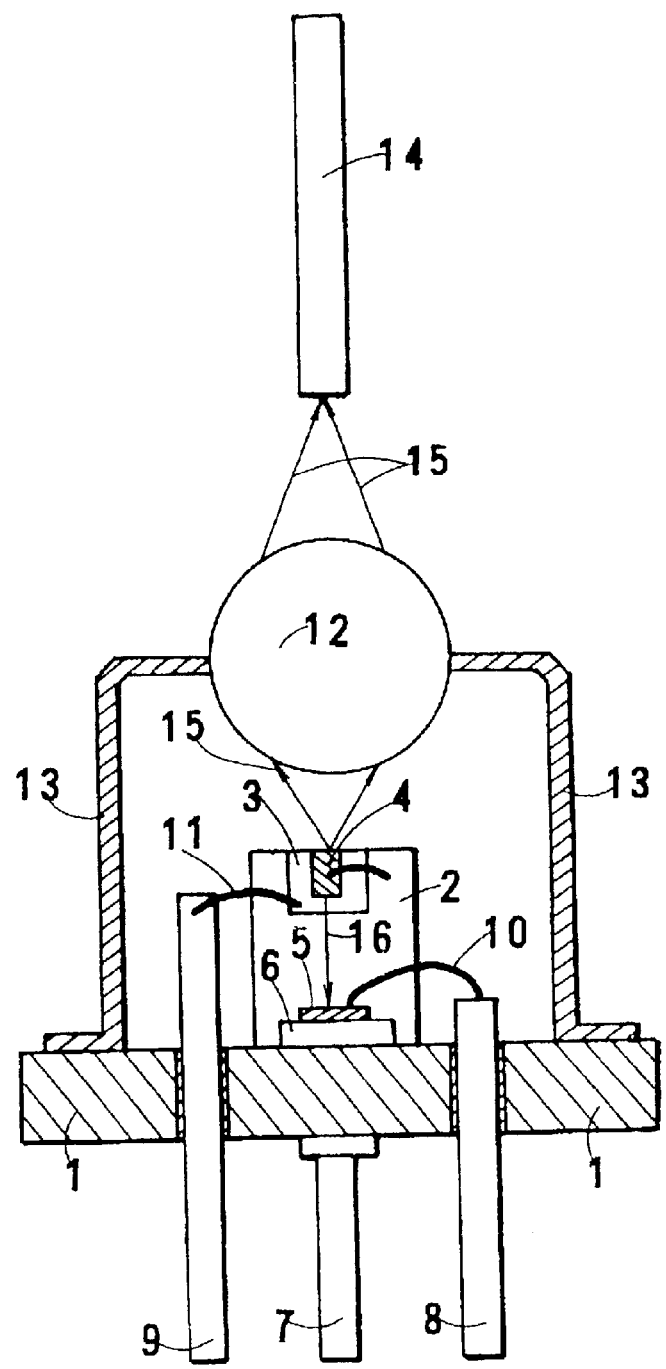
FIG. 1 is a diagram showing a prior-art optical transmission module.
Figure 2:
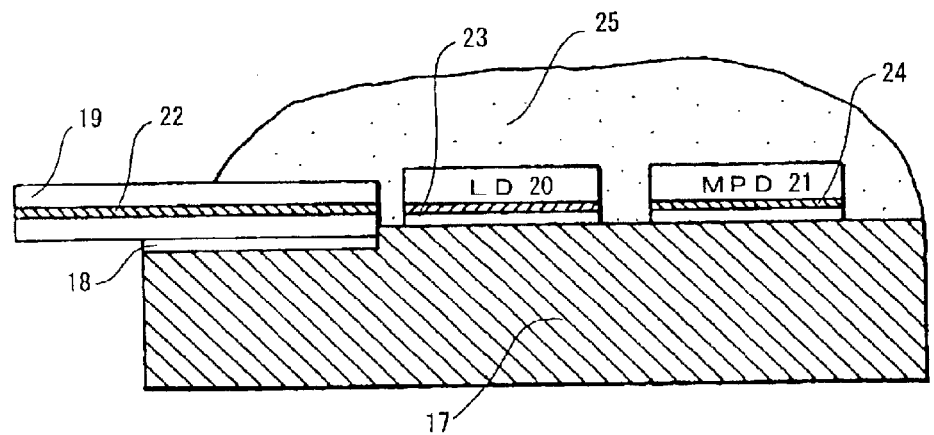
FIG. 2 is an axial cross-section view showing the LD module set forth in "Optical Coupling Characteristics of Resin Mold Type LD Module" by Koji Yoshida, Takeshi Kato, Toshinori Hirata, Fumio Yuki, Kimio Tateno, and Toshio Miura, 1997, The Institute of Electronics, Information and Communication Engineers, General Convention, C-3-68, p. 253.

In the optical communication modules according to the first and second embodiments in which the MPD was produced by inclining 45 degrees with respect to the optical axis, monitoring currents exceeding that of the prior art shown in FIG. 2, were achieved. Despite an oblique incidence, the light receiving diameter is large, and the optical axis of the LD and the center of the light detecting surface are aligned with each other, and hence, a high coupling efficiency is attained.

In the above-described first and second embodiments, the part on which the MPD is to be mounted is formed by metallizing the resin surface, and the leads are usually brazed onto metallized parts. In order to further shorten the process and facilitate the production, it is desirable to embed the lead frames in the second substrate into one piece. Such examples will be described with reference to the third and fourth embodiments.

Figure 6:
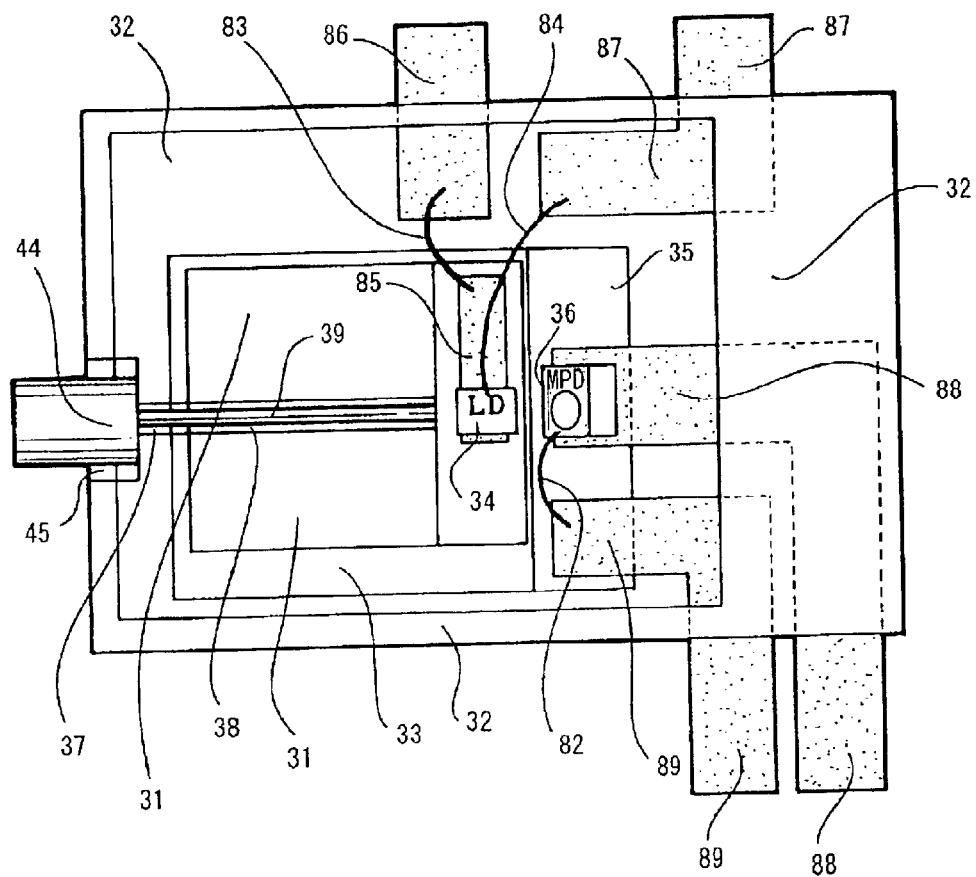
FIG. 6 is a plan view showing an optical communication module produced by insert molding according to a third embodiment of the present invention where an optical fiber is used as an optical transmitting medium.
Figure 7:
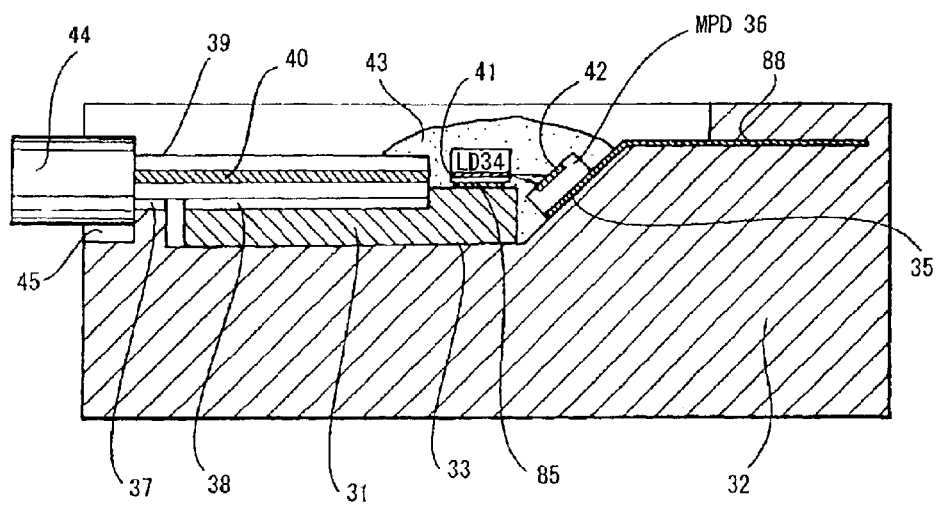
FIG. 7 is an axial cross-section view showing the optical communication module produced by insert molding according to the third embodiment of the present invention where an optical fiber is used as an optical transmitting medium.

[Third Embodiment (Optical Fiber with Ferrule: Lead Frames Embedded: FIGS. 6 and 7)]

FIG. 6 is a plan view showing a module according to a third embodiment, and FIG. 7 is an axial cross-section view thereof. As in the case of the second embodiment, the present embodiment is such that a ferrule is affixed to the optical fiber for the ease of handling. The structure of the first substrate 31 for coupling the optical fiber and the LD together is the same as the above-described embodiments. In this third embodiment, to further shorten the process, lead frames are embedded in the second substrate into one piece.

The first substrate 31 is an Si single crystal substrate, and an LD 34 is fixed on a metallized pattern 85 at the rearward part thereof. A V-groove 38 for the optical fiber is provided in the frontward part of the first substrate 31. This first substrate 31 is inserted into and fixed to the recess 33 of the second substrate 32. A cylindrical ferrule 44 is fixed to the front end of the optical fiber 39. On the surface of the second substrate 32, there are provided a V-groove 37 for fixing the optical fiber 39, and a larger V-groove 45 for fixing the ferrule 44, besides the above-described recess 33. Since the second substrate is produced by a mold, such unevenness can easily be made. As in the cases of the above-described embodiments, the MPD 36 is inclined by 45 degrees with respect to the optical axis, and is fixed to the lead frame 88 on the inclined surface 35 behind the LD.

In the above-described embodiments, metallized patterns were formed on the second substrate 32, and lead frames were brazed to the metallized patterns. In the third embodiment, however, the lead frames 86, 87, 88, and 89 are embedded simulteneously when the second substrate is foemed by a mold. The molding method in which lead frames are inserted in this manner is referred to as "insert molding".

A top electrode of the MPD 36 is connected by a wire 82 to the lead frame 89 thus embedded. The lead frame 87, which was simultaneously embedded, is connected to the bottom electrode (which face upward since the epitaxial face is upside-down) of the LD 34 by a wire 84. A metallized pattern 85 for LD is vapor-deposited on the first substrate 31, and a lead frame 86 is connected to the metallized pattern 85 by a wire 83. Thereafter, a part including the LD, MPD, and optical fiber is covered with a transparent resin 43 as shown in FIG. 7.

The processes where a metallized pattern is formed on the surface of the second substrate, and thereafter where lead frames are brazed thereto as in the above-described embodiments, are omitted here. Insert-molding shortens the process, and further facilitate producing a module, thereby allowing an inexpensive module to be realized.

Figure 8:
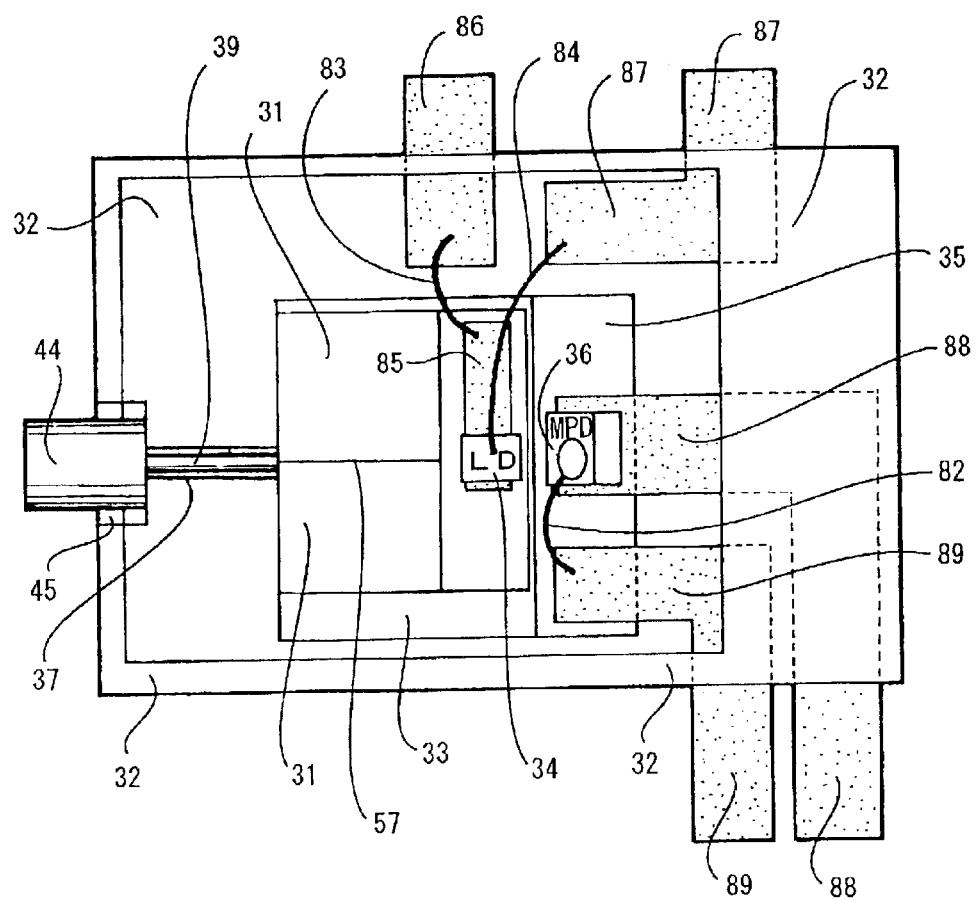
FIG. 8 is a plan view showing an optical communication module produced by insert-molding according to a fourth embodiment of the present invention where an optical fiber and an optical waveguide are used as an optical transmitting medium.
Figure 9:
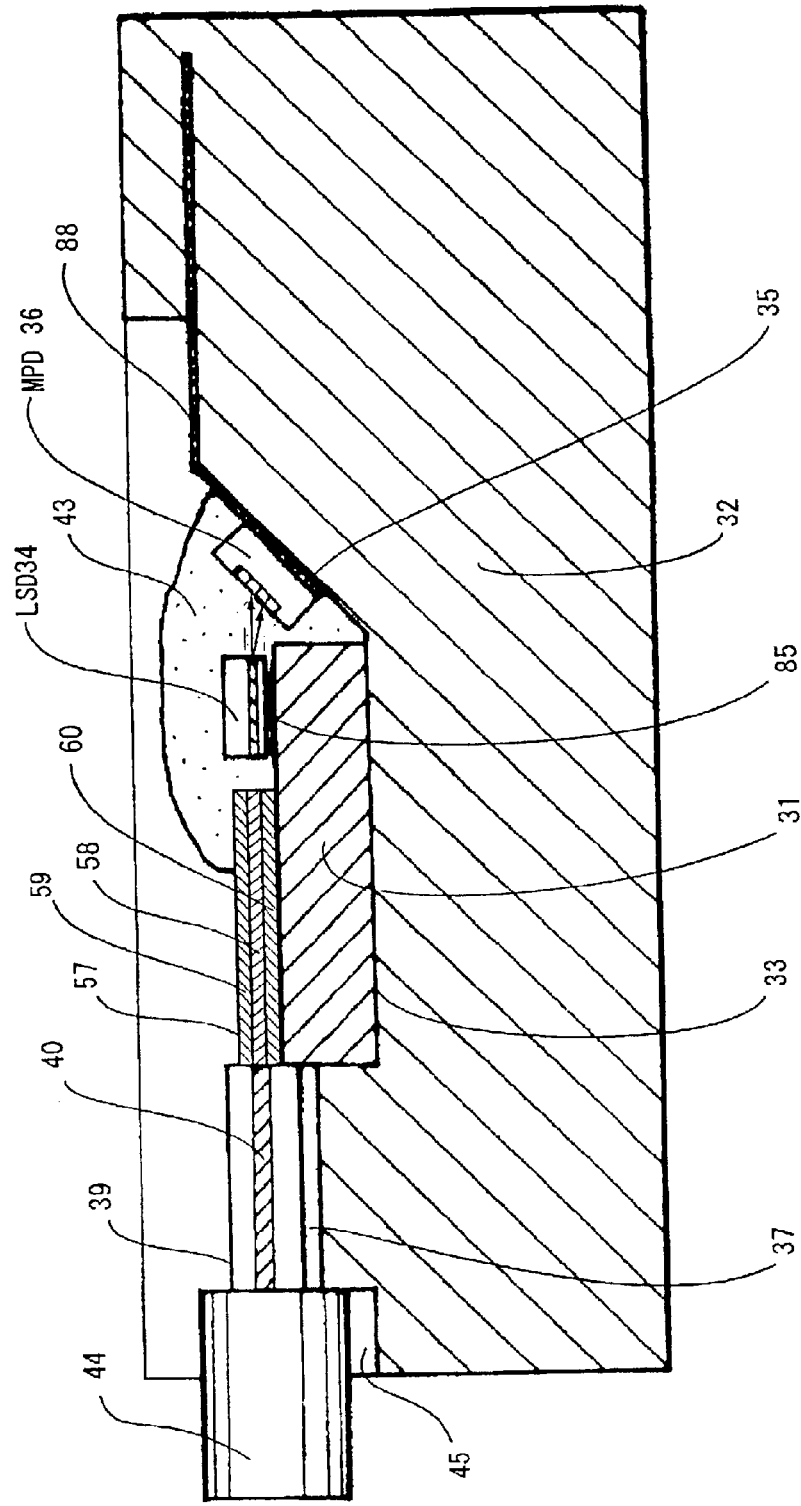
FIG. 9 is an axial cross-section view showing an optical communication module produced by insert-molding according to the fourth embodiment of the present invention where an optical fiber and an optical waveguide are used as an optical transmitting medium.

[Fourth Embodiment (Optical Fiber with Ferrule: Optical Waveguide: Embedded Lead Frames: FIGS. 8 and 9)]

A fourth embodiment of the present invention will be described using FIGS. 8 and 9. This is an embodiment where the optical fiber is not directly coupled to the LD but an optical waveguide is set between the optical fiber and the LD. In other respects, the present embodiment is the same as the third embodiment.

The first substrate 31 is an Si single crystal substrate, and a waveguide 57 extending in the axial direction is formed on the frontward part thereof. An LD 34 is fixed on the metallized pattern 85 at the rearward part of the first substrate 31. This first substrate 31 is inserted into and fixed to the recess 33 of the second substrate 32. A cylindrical ferrule 44 is fixed at a front end of the optical fiber 39. An optical waveguide 57 is formed at the other end of the optical fiber 39. On the surface of the second substrate 32, there are provided a V-groove 37 for fixing the optical fiber 39, and a larger V-groove 45 for fixing the ferrule 44, besides the above-described recess 33. Since the second substrate is produced by a mold, such unevenness can be easily made. As in the cases of the above-described embodiments, the MPD 36 is inclined by 45 degrees with respect to the optical axis, and is fixed to the lead frame 88 on the inclined surface 35 behind the LD.

The optical waveguide 57 comprises a core 58, an upper cladding 59, and a lower cladding 60, thereby forming an optical passage, which guides light. Since the first substrate 31 is an Si single crystal substrate, the first substrate 31 is produced by stacking $SiO_2$ layers thereover by sputtering or the like. The core 58 is a part that has a refractive index higher than the refractive indices of the claddings 59 and 60. Since doping $GeO_2$ into $SiO_2$ allows the refractive index to be increased, the core is produced by doping. The lower cladding layer 60 of $SiO_2$ is formed and an $SiO_2$—$GeO_2$ film is formed thereover. Then, by photolithography, a slight amount of the $SiO_2$—$GeO_2$ film is left in a stripe-shape, and further the upper cladding layer 59 of $SiO_2$ is uniformly formed thereover by sputtering. Thereby, a linear waveguide or a curved waveguide can be formed.

As in the case of the third embodiment, in the fourth embodiment, the processes for forming metallized patterns on the surface of the second substrate and thereafter brazing lead frames are thereto are omitted. Such insert-molding shortens the process, and further facilitates producing a device, thereby allowing an inexpensive module to be realized.

Figure 10:
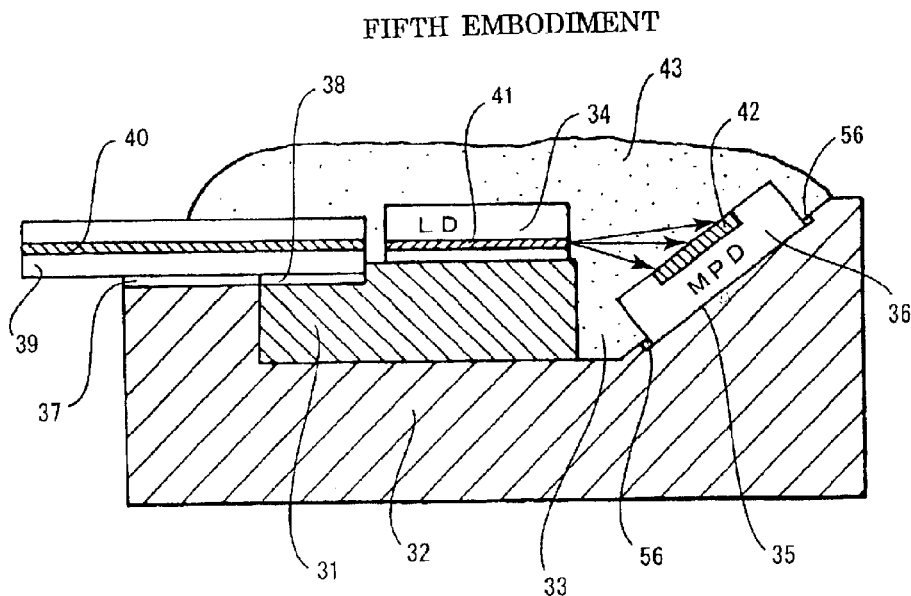
FIG. 10 is an axial cross-section view showing an optical communication module according to a fifth embodiment of the present invention where an optical fiber is used as an optical transmitting medium, and the MPD fixing groove is formed in a second substrate.

[Fifth Embodiment (Optical Fiber: MPD Fixing Groove: FIG. 10)]

In the first and second embodiments, a mark is previously put on the inclined surface of the second substrate 32, and the MPD is affixed to the inclined surface. Here, the fifth embodiment, in which an MPD fixing groove is provided in place of the mark, will be described using FIG. 10. In FIG. 10, a first substrate 31 is fixed to the recess 33 of the second substrate 32 with a recess and an inclined surface, the second substrate being made of plastics (e.g., a liquid crystal polymer) or ceramics. A recess (fixing groove) 56 which is slightly wider than the surface of the MPD 36, is provided on the inclined surface 35, on which the MPD 36 is to be mounted, of the second substrate 32. The fixing groove 56 constitutes a positioning mark when the MPD 36 is mounted, and also can prevent solder from flowing into the horizontal surface for fixing the Si-substrate.

Other features of this embodiment are the same as those of the first embodiment. An LD 34 is fixed onto the first substrate 31 with an epitaxial face upside-down, and the optical fiber 39 is inserted into and fixed to the V-grooves 37 and 38. The coupling between the LD 34 and the optical fiber 39 is optimized by the V-groove 38. The core 40 of the optical fiber 39, the light emitting part (stripe; active layer) 41 of the LD 34, and the light receiving part 42 of the MPD 36 are arranged in a straight line. The surface of the MPD is covered with an anti-reflection coating. The front light of the LD 34 enters the optical fiber 39, and the rear light thereof enters the MPD 36. This embodiment also utilizes a surface incident type PD as a monitor. Of course, the surface incident type PD can be replaced with a rear-surface incident type PD. Since monitoring light directly enters the MPD and the amount of monitoring light increases, the control of the driving current with respect to the LD becomes accurate.

Figure 11:
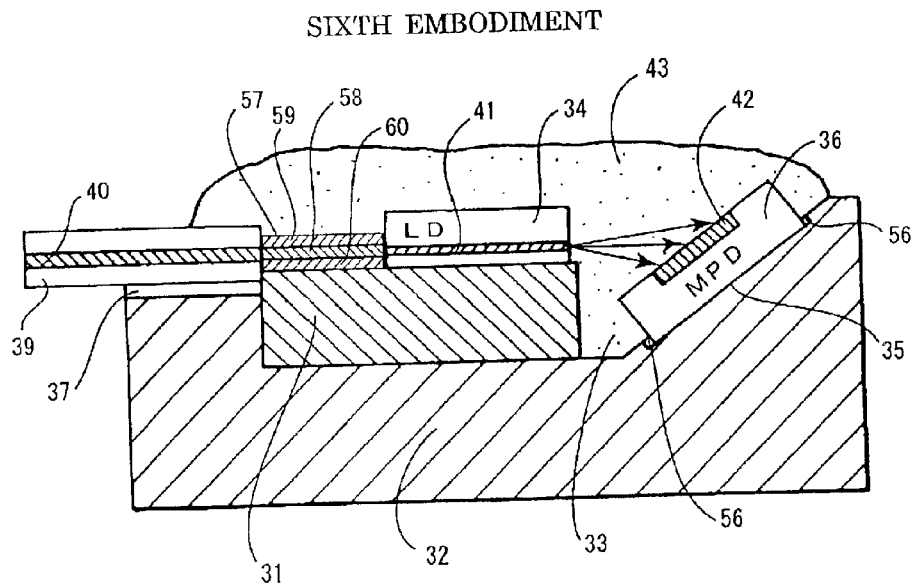
FIG. 11 is an axial cross-section view showing an optical communication module according to a sixth embodiment of the present invention where an optical waveguide is used as an optical transmitting medium.

[Sixth Embodiment (Optical Waveguide: MPD Fixing Groove: FIG. 11)]

FIG. 11 shows a sixth embodiment of the present invention. This is an embodiment where the optical fiber is not directly coupled to the LD but an optical waveguide is set between the optical fiber and the LD. In other respects, the present embodiment is the same as the first and fifth embodiments.

The first substrate 31 is fixed in the recess 33 of the second substrate 32. A fixing grove 56 is provided on the inclined surface 35 at the rearward part of the second substrate 32, and an MPD 36 is mounted on the fixing groove 56. While the LD 34 is affixed to the rear half part of the first substrate 31 as in the cases of the above-described embodiments, an optical waveguide 57 is formed on the front half part of the first substrate 31. An optical fiber 39 is affixed to the front end of the optical waveguide 57. The second substrate 32 has a V-groove 37 for holding the optical fiber 39, while the first substrate 31 has no V-groove for holding the optical fiber since the optical waveguide is continuous therewith. The LD 34, the MPD 36, the optical fiber 39, the optical waveguide 57 and the like are covered with a transparent resin 43.

The optical waveguide 57 comprises a core 58, an upper cladding 59, and a lower cladding 60, thereby forming an optical passage, which guides light. Since the first substrate 31 is an Si single crystal substrate, the first substrate is produced by stacking $SiO_2$ layers thereover by sputtering or the like. The core 58 is a part that has a refractive index higher than the refractive indices of the claddings 59 and 60. Since doping $GeO_2$ into $SiO_2$ allows the refractive index to be increased, the core is produced by doping. The lower cladding layer 60 of $SiO_2$ is formed and an $SiO_2$—$GeO_2$ film is formed thereover. Then, a slight amount of the $SiO_2$—$GeO_2$ film is left in a stripe-shape by photolithography, and further an upper cladding layer 59 is uniformly formed thereover by sputtering. Here, an example of an $SiO_2$-based layer has been described, but an organic polymer-based layer may instead be used. Thereby, a linear waveguide or a curved waveguide can be formed.

Here, besides providing a simple light guiding mechanism, it is possible to form a grating in which refractive index varies periodically. This grating can be produced, for example, by curing a photoresist by the two-beam interferometric exposing method, and selectively performing $GeO_2$ doping. Furthermore, a Y-shape branch can be formed in the optical waveguide. It is also possible to impart a wavelength selective property to the optical waveguide by providing a wavelength division multiplexer (WDM) at the branch part of the Y-shape branch. The optical waveguide is suited to the addition of such a special function.

Use of an optical waveguide makes it possible to form a grating therein, to provide a wavelength selective function, and to add a Y-shape branch and/or WDM function. The addition of such a function allows bidirectional light to be treated and enables cross talk therebetween to be inhibited. As a result, the receiving function can be integrated with the transmitting function. The present invention, therefore, can be applied to a transceiver, which integrates an optical transmitter and an optical receiver into one system. Hence, the present invention uses the designation "optical communication module", which is a concept comprehending an optical transmitter, an optical receiver, and an optical transceiver.

Figure 12:
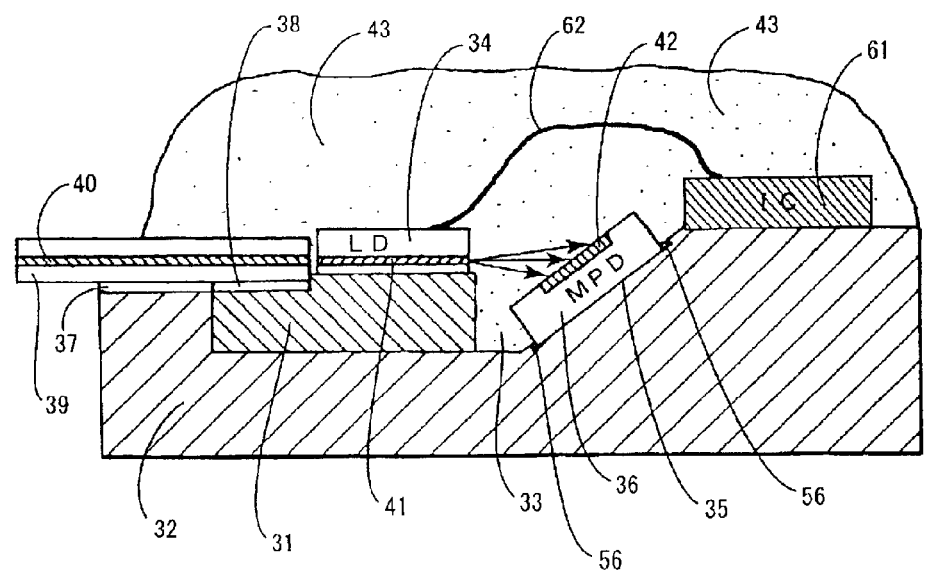
FIG. 12 is an axial cross-section view showing an optical communication module according to a seventh embodiment of the present invention where an optical fiber is used as an optical transmitting medium, and an LD driving IC is mounted in the device.

[Seventh Embodiment (LD Driving IC: FIG. 12)]

FIG. 12 shows a seventh embodiment of the present invention in which an LD driving IC is provided. A longer second substrate 32 is adopted, and a driving IC for the semiconductor laser is disposed behind the monitoring photodiode. In other respects, the present embodiment is the same as the above-described embodiments.

A recess 33 and an inclined surface 35 continuous with the recess 33 are formed in the central part of the second substrate 32. The rearward part of the second substrate stands the highest. A V-groove 37 is formed in a flat surface at the frontward part. A first substrate 31 is inserted into and fixed to the recess 33. An LD 34 for generating signal light is fixed to the first substrate 31, with an epitaxial face upside-down. An optical fiber 39 is inserted throughout the V-groove 38 of the first substrate 31 and the V-groove 37 of the second substrate 32, and is fixed thereto. A fixing groove 56 is provided on the inclined surface 35 at the rear half part of the second substrate 32, and a surface incident type MPD 36 is inserted into and fixed to the fixing groove 56.

A metallized pattern (not shown) is provided at a high flat part behind the inclined surface 35, and an LD driving IC 61 is fixed thereto. The electrode at an upper part of the LD driving IC 61and the electrode at an upper part of the LD 34 are directly interconnected by a wire 62. The LD 34, the optical fiber 39, the MPD 36, and the LD driving IC 61 are covered with a transparent resin 43. While only the LD 34, the MPD 36, and the optical fiber 39 need to be covered with the transparent resin 43, here the LD driving IC 61 is also covered together with them. The transparent resin 43 has flexibility even after being cured, and also has the effects of alleviating external shocks and stresses exerted on molded plastic resin and of protecting internal elements. As for the LD driving IC 61, buffering effect is expected.

The LD driving IC refers to one that provides the LD with a pulse current for causing the LD to generate pulse optical signals. Usually, the LD driving IC is mounted on a printed circuit board located outside the optical transmitting module, and the LD driving IC and the LD are interconnected by a wire pattern on the printed circuit board, a lead, and a wire. Since a signal line is long, and signals pass through the lead, the signals distort, and it is difficult to transmit a high-speed signal train. It is desirable if the LD driving IC could also be mounted on the same device; however, it has not been done actually as it is difficult to realize, since the MPD is usually located directly behind the LD and hence the LD driving IC must be disposed at the rear of the MPD.

However, when the LD driving IC is mounted in the same device as in the seventh embodiment by a short wire 62, the LD driving IC and the LD can be interconnected, thereby reducing signal distortion. Such a structure, therefore, is suitable for high-speed signal transmission.

As described above, in an ordinary device, it is difficult to incorporate an LD driving IC and an LD in the same device. In the present invention, however, the first substrate 31 is placed in the recess 33 of the second substrate 32, the LD 34 is disposed on the first substrate 31, and the MPD 36 is obliquely disposed on the inclined surface behind the first substrate 31. Since the upper part of the device is unoccupied, the LD driving IC 61 and the sub-mount of the LD 34 can easily be interconnected by a wire 62. Namely, since the MPD 36 is embedded in the inclined surface 35 located a little lower, such an interconnection within a very short range can be achieved.

Thereby, the drive output terminal of the IC and the electrode of the semiconductor laser can directly be coupled by a single Au wire within a very short range of only 1 mm or so. This provides a drive circuit of which the stray capacitance and the parasitic inductance are significantly low. Thus, a structure is obtained that is suited to a transmitter with a high frequency range of 5 Gbps to 10 Gbps. This is also a merit of the present invention that is difficult to achieve by an ordinary structure.

Figure 13:
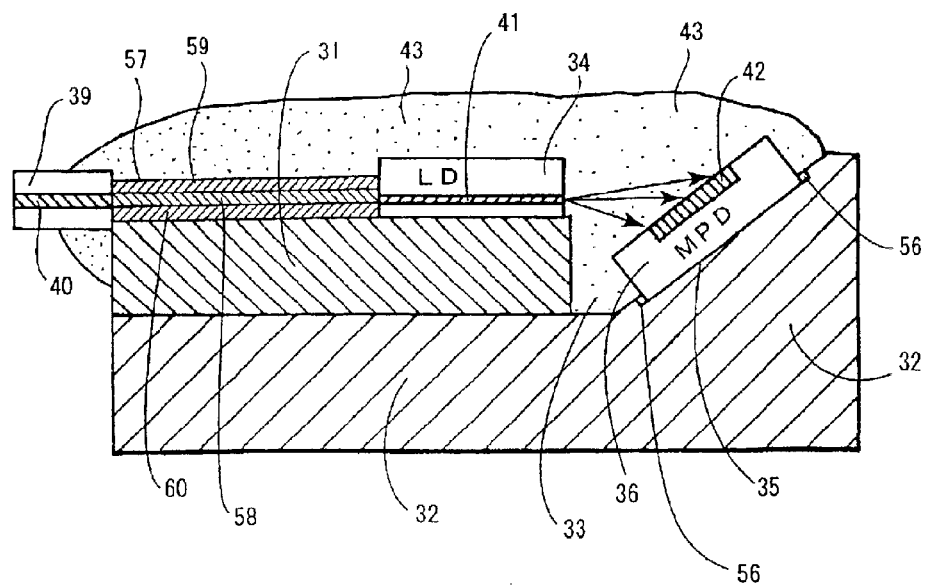
FIG. 13 is an axial cross-section view showing an optical communication module according to an eighth embodiment of the present invention where an optical waveguide is used as an optical transmitting medium.

[Eighth Embodiment (Optical Waveguide Extended Up to Front End: MPD Fixing Groove: FIG. 13)]

FIG. 13 shows an eighth embodiment of the present invention. This is an embodiment where an optical fiber is not directly coupled to the LD but an optical waveguide is set between the optical fiber and the LD, as in the case of the sixth embodiment. However, the present embodiment is different from the sixth embodiment in that the first substrate is extended up to the front end of the second substrate, and that an optical waveguide is formed up to the front end of the first substrate 31.

A recess 33 is formed up to the front end of the second substrate 32. Thereafter, an inclined surface 35 is formed on the second substrate 32. A first substrate 31 longer than the first substrates in the above-described embodiments is fixed in the long recess 33. An optical waveguide 57 longer than that of the sixth embodiment is formed at the first half part of the first substrate 31. An optical fiber 39 is coupled to the front end of the optical waveguide 57. That is, the end faces of the optical fiber 39, first substrate 31, and second substrate 32 are on the same plane. The second substrate 32 has no V-groove to hold the optical fiber. The first substrate 31 also has no V-groove to hold the optical fiber, since the optical waveguide 57 is continuous therewith.

A fixing groove 56 is provided on the inclined surface 35 at the rearward part of the second substrate 32, and the MPD 36 is mounted to the fixing groove 56. An LD 34 is affixed to the second half part of the first substrate 31 so as to be continuous with the optical waveguide. The core 40 of the optical fiber 39, the core 58 of the optical waveguide 57, the light emitting part 41 of the LD 34, and the light receiving part 42 of the MPD 36 are arranged in a straight line. The LD 34, the MPD 36, the optical fiber 39, the optical waveguide 57 and the like are covered with a transparent resin 43.

The optical waveguide 57 comprises a core 58, an upper cladding 59, and a lower cladding 60, thereby forming an optical passage, which guides light. The optical waveguide can be produced by the same method as that in the sixth embodiment.

As described with respect to the sixth embodiment, in the optical waveguide 57, it is possible to form a Y-shape branch and a grating in which a refractive index periodically varies, besides providing a simple light guiding mechanism. It is also possible to impart a wavelength selective property to the optical waveguide by providing a Wavelength Division Multiplexer (WDM) at the branch part of the Y-shape branch. The eighth embodiment is more suited to the addition of such a special function as compared with the sixth embodiment, since the optical waveguide part is longer in the eighth embodiment.

What is claimed is:

1. An optical communication module comprising
a first substrate; and
a second substrate having a recess for accommodating said first substrate,
wherein a wall surface of said recess continuous thereto is an inclined surface;
a semiconductor laser (LD) for generating front light and rear light and a transmitting medium for transmitting said front light to the outside are provided on said first substrate;
a monitoring photodiode (MPD) for receiving the rear light of said semiconductor laser is fixed on said inclined surface; and
an electrical connection means for electrically connecting an electrode of said semiconductor laser (LD) and an electrode of said monitoring photodiode (MPD) to a respective exterior circuit is provided on said first and second substrates, respectively.

2. An optical communication module according to claim 1, wherein the first substrate is an Si single crystal substrate.

3. An optical communication module according to claim 1, wherein the second substrate is a ceramics substrate.

4. An optical communication module according to claim 1, wherein the second substrate is a polymer substrate.

5. An optical communication module according to any one of claims 1, 2, and 4, wherein the first substrate is an Si single crystal substrate, and wherein the second substrate is a liquid-crystal polymer.

6. An optical communication module according to any one of claims 1 to 4, wherein the optical transmitting medium is an optical fiber.

7. An optical communication module according to any one of claims 1 to 4, wherein the optical transmitting medium includes an optical waveguide that is formed on the first substrate.

8. An optical communication module according to claim 7, wherein the optical waveguide is an $SiO_2$-based waveguide or an organic polymer-based waveguide.

9. An optical communication module according to any one of claims 1 to 4, wherein a fixing groove for fixing the monitoring photodiode (MPD) and wider than the monitoring photodiode (MPD) is provided in the inclined surface of the second substrate.

10. An optical communication module according to any one of claims 1 to 4, wherein the second substrate is formed by insert-molding lead frames.

11. An optical communication module according to claim 10, wherein the monitoring photodiode (MPD) is mounted on the inclined surface having the lead frames.

12. An optical communication module according to any one of claims 1 to 4, wherein the monitoring photodiode (MPD) is disposed such that the center of the light detecting surface thereof is substantially located on an extension line of the optical axis of rear light of the semiconductor laser (LD), and wherein the monitoring photodiode (MPD) is disposed such that the inclination angle of the light detecting surface with respect to the optical axis of the laser rear light is in a range of 30 to 60 degrees.

13. An optical communication module according to any one of claims 1 to 4, wherein the space between the optical transmitting medium and the semiconductor laser (LD), and the space between the semiconductor laser (LD) and the monitoring photodiode (MPD) are covered with a transparent resin.

14. An optical communication module according to any one of claims 1 to 4, wherein an anti-reflection coating is formed over the light detecting surface of the monitoring photodiode (MPD).

15. An optical communication module according to any one of claims 1 to 4, wherein the semiconductor laser (LD) comprises an InGaAsP-based crystal, and wherein the monitoring photodiode (MPD) comprises an InGaAs-based or InGaAsP-based crystal.

16. An optical communication module according to any one of claims 1 to 4, wherein a semiconductor laser (LD) driving element is disposed behind the monitoring photodiode (MPD) on the second substrate.

* * * * *